(12) United States Patent
Dozaka (10) Patent No.: US 11,990,192 B2
(45) Date of Patent: May 21, 2024

(54) INTEGRATED CIRCUIT WITH ESD PROTECTION

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Toshiaki Dozaka, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 60 days.

(21) Appl. No.: 17/684,190

(22) Filed: Mar. 1, 2022

(65) Prior Publication Data

US 2023/0126057 A1  Apr. 27, 2023

(30) Foreign Application Priority Data

Oct. 22, 2021  (JP) ................................. 2021-172764

(51) Int. Cl.
*G11C 17/18* (2006.01)
*H01L 27/02* (2006.01)
(Continued)

(52) U.S. Cl.
CPC .......... *G11C 17/18* (2013.01); *H01L 27/0266* (2013.01); *H01L 27/0288* (2013.01);
(Continued)

(58) Field of Classification Search
CPC ..... G11C 17/18; G11C 17/16; H01L 27/0266; H01L 27/0288; H01L 27/0292; H02H 9/045; H02H 9/046
See application file for complete search history.

(56) References Cited

U.S. PATENT DOCUMENTS

| 7,463,503 B2 | 12/2008 | Morii |
| 8,009,396 B2 * | 8/2011 | Bernard ................. H02H 9/046 361/111 |

(Continued)

FOREIGN PATENT DOCUMENTS

| JP | 2007081122 A | 3/2007 |
| JP | 2015103689 A | 6/2015 |

(Continued)

OTHER PUBLICATIONS

Electronic Circuit and Sensor System (Year: 2019).*

*Primary Examiner* — Sultana Begum
(74) *Attorney, Agent, or Firm* — Kim & Stewart LLP (57) ABSTRACT

According to one embodiment, an integrated circuit includes a first power supply line, a protection circuit, an internal circuit, a second transistor, and a shutoff control circuit. A first power supply voltage is supplied to the first power supply line. The protection circuit is connected to the first power supply line. The internal circuit includes a first transistor whose breakdown voltage is lower than the first power supply voltage. A drain or a source of the first transistor is connected to the first power supply line. The second transistor is on the first power supply line between the protection circuit and the internal circuit and is configured to switch between conduction and non-conduction states to connect and disconnect the protection circuit and the internal circuit from one another along the first power supply line. The shutoff control circuit is configured to turn off the second transistor during an ESD operation.

18 Claims, 10 Drawing Sheets

(51) Int. Cl.
*H02H 9/04* (2006.01)
*G11C 17/16* (2006.01)

(52) U.S. Cl.
CPC ......... *H01L 27/0292* (2013.01); *H02H 9/045* (2013.01); *G11C 17/16* (2013.01)

(56) References Cited

U.S. PATENT DOCUMENTS

| | | | |
|---|---|---|---|
| 9,985,433 B2 | 5/2018 | Takada | |
| 2007/0267701 A1* | 11/2007 | Sung | ............... H01L 27/0266 257/365 |
| 2017/0338221 A1* | 11/2017 | Huang | ............... H01L 27/0285 |
| 2019/0006842 A1 | 1/2019 | Watanabe | |
| 2021/0083471 A1 | 3/2021 | Watanabe | |
| 2021/0295934 A1 | 9/2021 | Dozaka | |
| 2021/0328425 A1* | 10/2021 | Jou | ............... H01L 27/0255 |

FOREIGN PATENT DOCUMENTS

| | | | |
|---|---|---|---|
| JP | 2015173214 A | 10/2015 | |
| JP | 2019012753 A | 1/2019 | |
| JP | 2021044488 A | 3/2021 | |
| JP | 2021149989 A | 9/2021 | |
| WO | WO-2020080304 A1 * | 4/2020 | ....... G01R 19/16576 |

\* cited by examiner

INTEGRATED CIRCUIT WITH ESD PROTECTION

CROSS-REFERENCE TO RELATED APPLICATION

This application is based upon and claims the benefit of priority from Japanese Patent Application No. 2021-172764, filed Oct. 22, 2021, the entire contents of which are incorporated herein by reference.

FIELD

Embodiments described herein relate generally to integrated circuits and electrostatic protection thereof.

BACKGROUND

An electronic circuit, such as an integrated circuit, can be provided with a protection circuit for protection from electrostatic discharge (ESD).

If an integrated circuit has a power supply terminal for a high voltage (for example, 5 V) but is provided with an internal circuit that operates at a low voltage (for example, 1.5 V), the integrated circuit may require a separate power supply terminal for the lower voltage. However, in general, the number of available terminals of an integrated circuit is limited, and in some cases, a low-voltage power supply terminal may not be provided easily.

In such cases, the low-voltage operating internal circuit must be connected in some to the high-voltage power supply terminal for operating power. Thus, a high-voltage protection circuit for protecting the high-voltage power supply terminal from ESD and a low-voltage protection circuit for protecting the internal circuit from ESD may be provided. However, since it is necessary to provide two ESD protection circuits, the total required circuit area increases.

DETAILED DESCRIPTION

Embodiments provide an integrated circuit for which a required circuit area (e.g., device die size) can be small.

In general, according to one embodiment, an integrated circuit includes a first power supply line, a protection circuit, an internal circuit, a second transistor, and a shutoff control circuit. A first power supply voltage is supplied to the first power supply line. The protection circuit is connected to the first power supply line. The internal circuit includes a first transistor whose breakdown voltage is lower than the first power supply voltage. A drain or a source of the first transistor is connected to the first power supply line. The second transistor is on the first power supply line between the protection circuit and the internal circuit and is configured to switch between conduction and non-conduction states to connect and disconnect the protection circuit and the internal circuit along the first power supply line. The shutoff control circuit is configured to turn off the second transistor during an ESD operation.

According to another embodiment, an integrated circuit includes a first power supply line, an internal circuit, a protection circuit, a second transistor, and a shutoff control circuit. A first power supply voltage is supplied to the first power supply line. The internal circuit includes a first transistor whose breakdown voltage is lower than the first power supply voltage. A drain or a source of the first transistor is connected to the first power supply line. The protection circuit includes a resistive element and a capacitive element which are connected in series between the first power supply line and a ground potential, a first inverter whose input terminal is connected between the resistive element and the capacitive element, and a fourth transistor that has a gate connected to an output terminal of the first inverter, a drain connected to the first power supply line, and a source connected to the ground potential. The second transistor is on the first power supply line between the drain of the fourth transistor and the internal circuit and is configured to switch between conduction and non-conduction states to connect and disconnect the protection circuit and the internal circuit from one another along the first power supply line. The shutoff control circuit includes a third transistor that has a gate connected to the output terminal of the first inverter by a path, a drain connected to a gate of the second transistor, and a source connected to the ground potential.

According to still another embodiment, an integrated circuit includes a first power supply line, an internal circuit, a protection circuit, a second transistor, and a shutoff control circuit. A first power supply voltage is supplied to the first power supply line. The internal circuit includes a first transistor whose breakdown voltage is lower than the first power supply voltage. A drain or a source of the first transistor is connected to the first power supply line. The protection circuit includes a capacitive element, a resistive element, a first inverter, a second inverter, and a fourth transistor. A first end of the capacitive element is connected to the first power supply line. A first end of the resistive element is connected to a second end of the capacitive element, and a second end of the resistive element is connected to a ground potential. An input terminal of the first inverter is connected to a node between the resistive element and the capacitive element. An input terminal of the second inverter is connected to an output terminal of the first inverter. A gate of the fourth transistor is connected to an output terminal of the second inverter, a drain of the fourth transistor is connected to the first power supply line, and a source of the fourth transistor is connected to the ground potential. The second transistor is connected to the first power supply line between the drain of the fourth transistor and the internal circuit and is configured to switch between conduction and non-conduction states to connect and disconnect the protection circuit from the internal circuit along the first power supply line. The shutoff control circuit includes a third transistor that has a gate connected to the input terminal of the first inverter, a drain connected to the gate of the second transistor, and a source connected to the ground potential.

Hereinafter, certain example embodiments of the present disclosure will be described with reference to the accompanying drawings. Components, elements, parts, and the like which are the same among the embodiments and the drawings are denoted by the same reference numerals. Since the drawings are, in general, schematic or conceptual, dimensions, dimensional ratios, and the like depicted in the drawings are not necessarily those found in an actual implementation. The present disclosure is not limited to the specific example embodiments.

First Embodiment (Structure of Integrated Circuit 100)

An integrated circuit 100 according to a first embodiment will be described with reference to FIG. 1.

The integrated circuit 100 includes a first power supply line PW1, a protection circuit 11 (also referred to as a high-voltage (HV) protection circuit 11), an internal circuit 12, a shutoff control circuit 13, and a control circuit 14.

The first power supply line PW1 is connected to a first power supply (not separately depicted). A first power supply voltage Vdd is applied to the first power supply line PW1. The first power supply voltage Vdd is, for example, 5 V.

Figure 3:
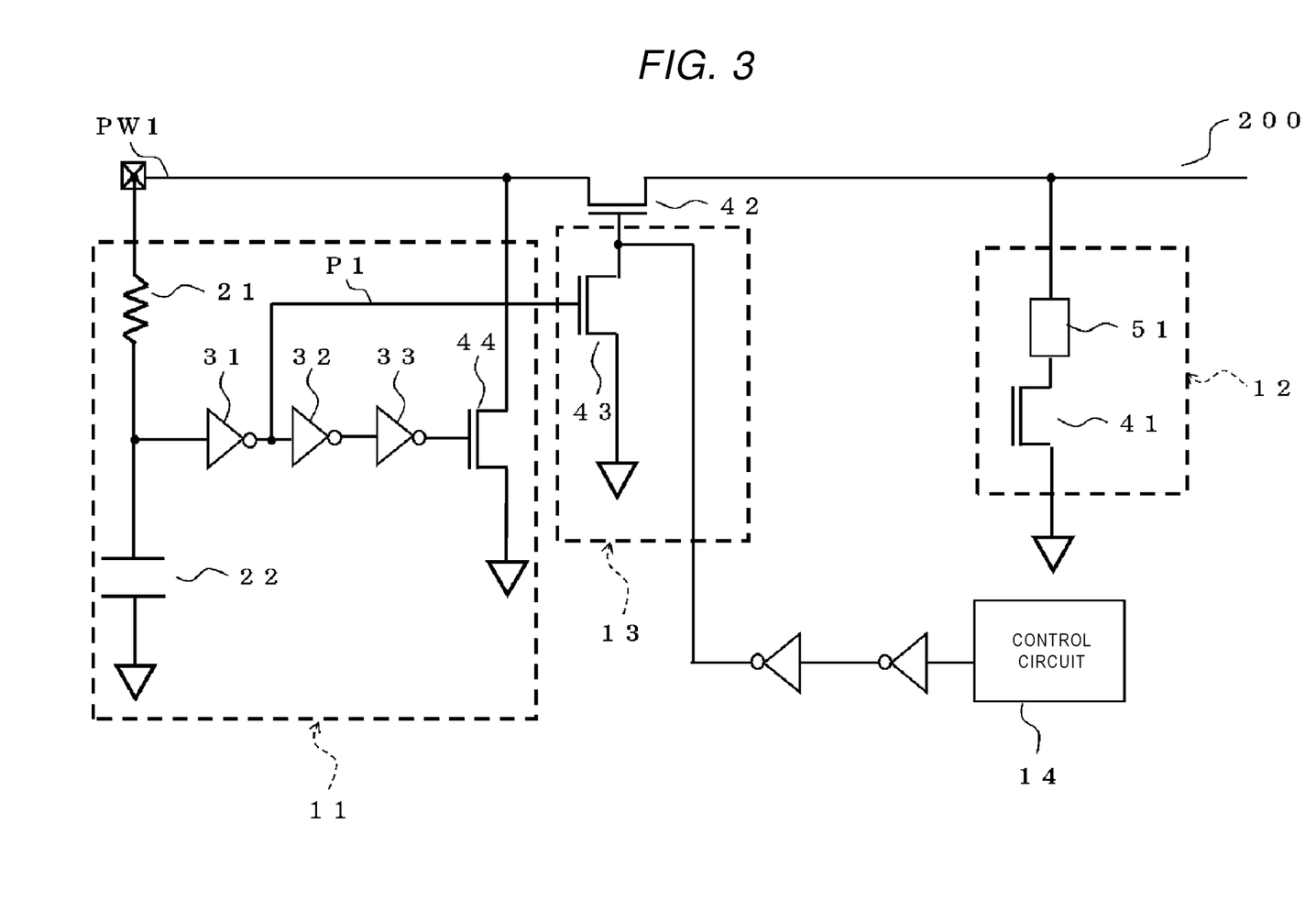
FIG. 3 is a circuit diagram of an integrated circuit according to a second embodiment.

The high-voltage (HV) protection circuit 11 is connected between the first power supply line PW1 and a ground potential. The HV protection circuit 11 may include a transistor (for example, a fourth transistor 44 as shown in FIG. 3) whose breakdown voltage is higher than a breakdown voltage of a first transistor 41 of the internal circuit 12.

A second transistor 42 is connected to the first power supply line PW1 between the HV protection circuit 11 and the internal circuit 12. The second transistor 42 is, for example, an n-channel metal-oxide-semiconductor (MOS) transistor. A drain of the second transistor 42 is connected to the first power supply line PW1 on a HV protection circuit 11 side. A source of the second transistor 42 is connected to the internal circuit 12 via the first power supply line PW1. The second transistor 42 switches between conduction and non-conduction of a current flowing through the first power supply line PW1 between the HV protection circuit 11 and the internal circuit 12. The second transistor 42 has a breakdown voltage higher than the breakdown voltage of the first transistor 41.

In the present embodiment, the first transistor 41, the second transistor 42, a third transistor 43, and the fourth transistor 44 (see FIG. 3) are n-channel MOS transistors. In another embodiment, the first transistor 41, the second transistor 42, the third transistor 43, and the fourth transistor 44 may be p-channel MOS transistors.

The internal circuit 12 is connected between the first power supply line PW1 and the ground potential. The internal circuit 12 is connected to the source of the second transistor 42 through the first power supply line PW1. The internal circuit 12 includes the first transistor 41 whose breakdown voltage is lower than the first power supply voltage Vdd. The internal circuit 12 is, for example, a one-time programmable (OTP) memory. When the internal circuit 12 is an OTP memory, the internal circuit 12 further includes a fuse element 51. The fuse element 51 is between the drain of the first transistor 41 and the first power supply line PW1.

The shutoff control circuit 13 includes a resistive element 21, a capacitive element 22, a first inverter 31, and the third transistor 43. One end of the resistive element 21 is connected to the first power supply line PW1 between the HV protection circuit 11 and the drain of the second transistor 42. The resistive element 21 is, for example, a poly resistor. One end of the capacitive element 22 is connected to another end of the resistive element 21, and another end of the capacitive element 22 is connected to the ground potential. The capacitive element 22 is, for example, a gate capacitance of a MOS transistor. An input terminal of the first inverter 31 is connected between the resistive element 21 and the capacitive element 22. A gate of the third transistor 43 is connected to an output terminal of the first inverter 31. A drain of the third transistor 43 is connected to a gate of the second transistor 42. A source of the third transistor 43 is connected to the ground potential. The third transistor 43 has a breakdown voltage higher than the breakdown voltage of the first transistor 41.

Figure 1:
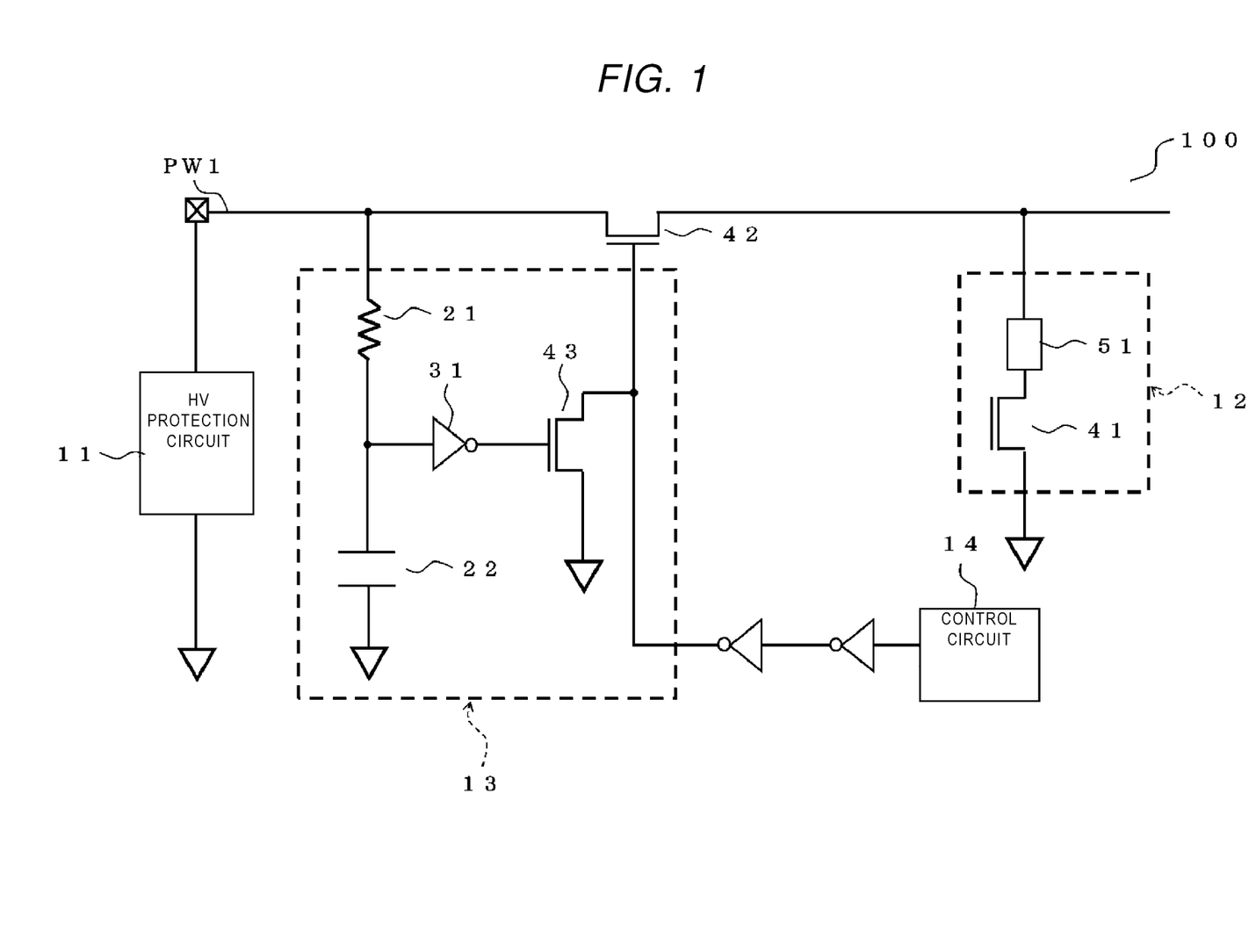
FIG. 1 is a circuit diagram of an integrated circuit according to a first embodiment.
Figure 4:
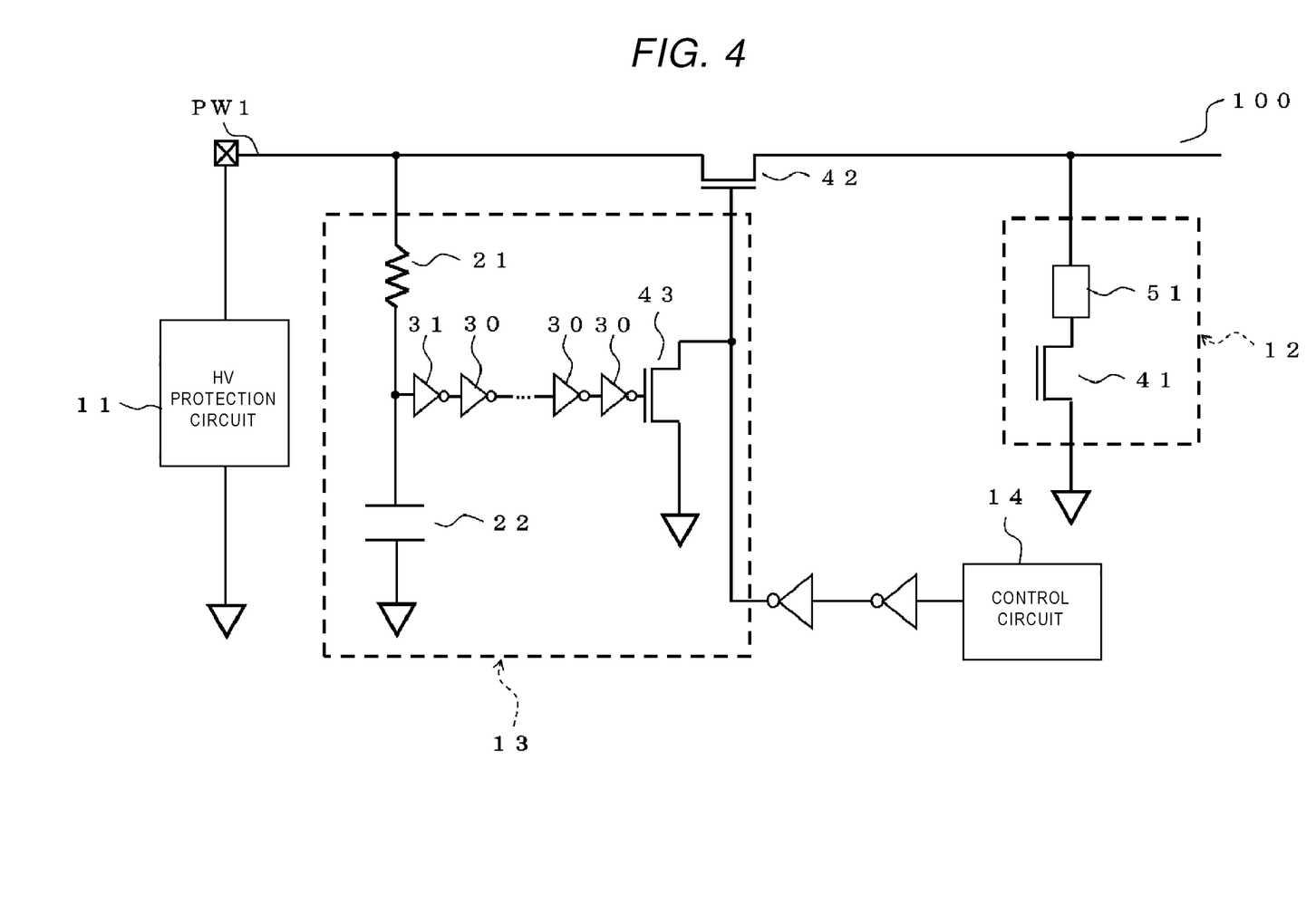
FIG. 4 is a circuit diagram of an integrated circuit according to a first embodiment.

FIG. 1 shows the case where only a first inverter 31 is connected between the gate of the third transistor 43 and a portion or a node between the resistive element 21 and the capacitive element 22. In another case, as shown in FIG. 4, at least one inverter 30 may be connected in series between the output terminal of the first inverter 31 and the gate of the third transistor 43. In the case where an inverter 30 (or a plurality of inverters 30) is provided between the first inverter 31 and the gate of the third transistor 43, the output terminal of the first inverter 31 and the gate of the third transistor 43 are still electrically connected to each other.

The control circuit 14 is connected to the gate of the second transistor 42.

(Operation of Integrated Circuit 100)

In the following description, the operating time or period during which the integrated circuit 100 operates in a state in which a power surge is occurring is referred to as "during an ESD operation." The operating time or period during which the integrated circuit 100 operates in a state in which the power supply is steady (e.g., no ESD event) is referred to as "during a normal operation."

During an ESD operation, when a positive voltage generated by ESD is applied to the first power supply line PW1 from the first power supply, an amount of charges of the first power supply line PW1 increases, and a potential of the first power supply line PW1 increases. The voltage generated by the ESD is, for example, several thousand volts. A resistance value R1 of the resistive element 21 and a capacitance C2 of the capacitive element 22 are determined such that a product R1×C2 (that is, a RC time constant) of the resistance value R1 and the capacitance C2 is sufficiently greater than a time during which an instantaneous surge current generated by the ESD flows in. During a time of the RC time constant, a potential between the resistive element 21 and the capacitive element 22 is lower than the potential of the first power supply line PW1. The first inverter 31 receives an L-level through the input terminal thereof and outputs an H-level. As a result, a voltage is applied to the gate of the third transistor 43, and the third transistor 43 is turned on. The drain of the third transistor 43 is at the ground potential. No voltage is applied to the gate of the second transistor 42, and the second transistor 42 is turned off. The surge current input to the first power supply line PW1 passes through the HV protection circuit 11 and is discharged to a ground instead of reaching the internal circuit 12.

During the normal operation in which no voltage generated by the ESD is applied to the first power supply line PW1, the first power supply voltage Vdd is maintained at a constant value. Therefore, charges are accumulated in the capacitive element 22. The potential between the resistive element 21 and the capacitive element 22 is higher than the potential of the first power supply line PW1. The first inverter 31 receives an H-level through the input terminal thereof and outputs an L-level. As a result, no voltage is applied to the gate of the third transistor 43, and the third transistor 43 is maintained at an off state.

During the normal operation, a voltage is applied to the gate of the second transistor 42 when writing into the OTP memory, which is one example of the internal circuit 12, is performed. For writing into the OTP, a predetermined fusing voltage that is lower than the first power supply voltage Vdd is applied to the first power supply line PW1. The fuse element 51 is fused at this time by application of the predetermined fusing voltage. In this context, fused refers to a shutoff of a part of a path of a current flow. In the present embodiment, the first power supply line PW1 and the first transistor 41 are disconnected. During the normal operation, when writing to the OTP memory is not being performed, no voltage is applied to the gate of the second transistor 42, and the second transistor 42 is turned off. The timing at which a voltage is applied to the gate of the second transistor 42 is controlled by the control circuit 14.

During the normal operation, read-out from the OTP memory is performed using a circuit pattern set at the time of read-in to (setting of) the OTP memory.

Effect of First Embodiment

Certain aspects of the integrated circuit 100 according to the first embodiment will be described in comparison with an integrated circuit 300 according to a comparative example depicted in FIG. 2. The components of the integrated circuit 300 that are the same or substantially the same as those of the integrated circuit 100 are denoted using the same reference numerals.

The integrated circuit 300 according to the comparative example is different from the integrated circuit 100 according to the first embodiment in that the integrated circuit 300 does not include the shutoff control circuit 13 but includes a low-voltage (LV) protection circuit 15.

The LV protection circuit 15 is an ESD protection circuit that includes a transistor having a breakdown voltage lower than the first power supply voltage Vdd applied to the first power supply line PW1.

Figure 2:
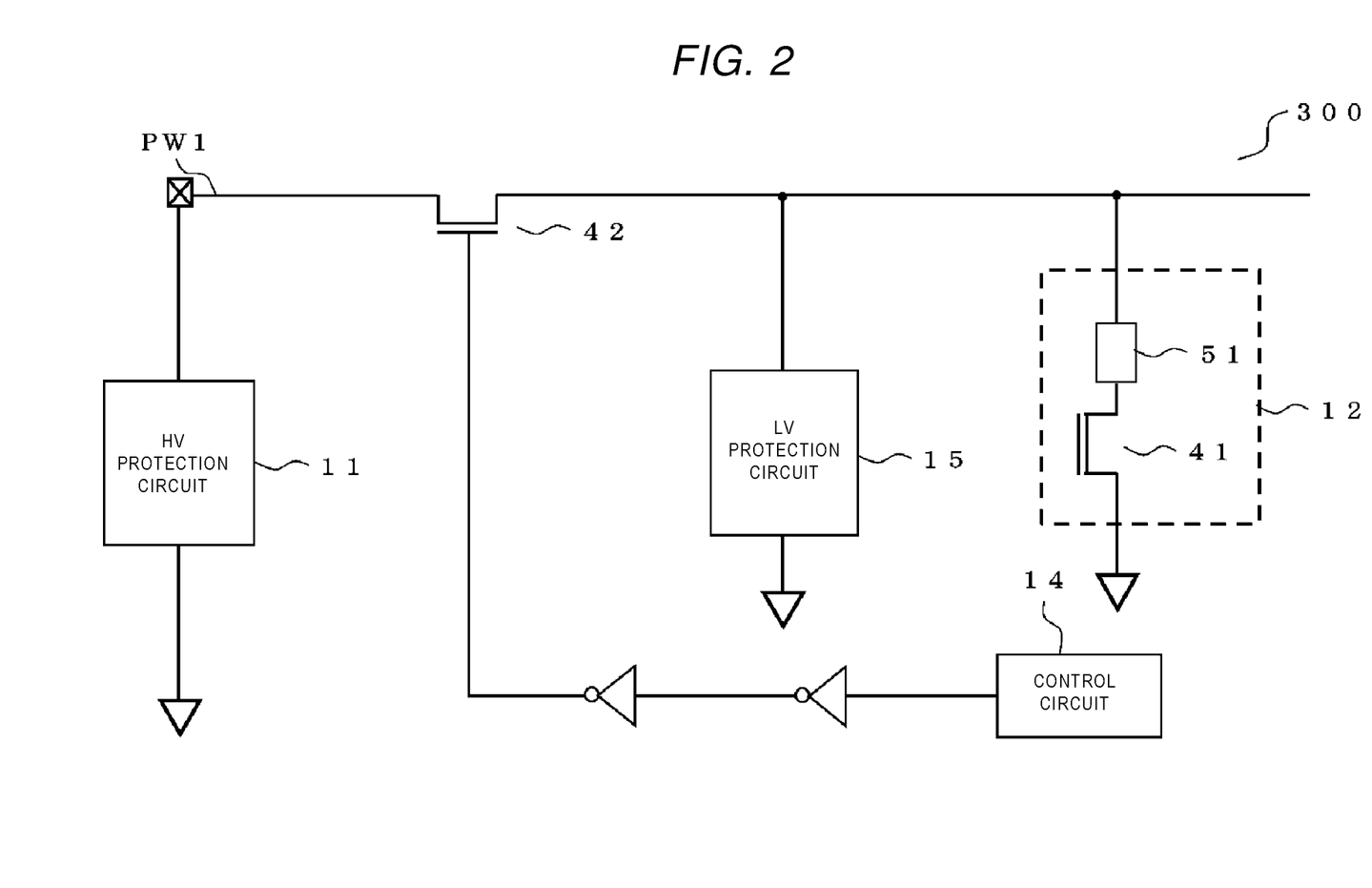
FIG. 2 is a circuit diagram of an integrated circuit according to a comparative example.

If the internal circuit 12 includes a transistor having a breakdown voltage lower than the first power supply voltage Vdd, it is necessary to provide the HV protection circuit 11 that protects the circuits to which the first power supply voltage Vdd is applied and the LV protection circuit 15 that protects the internal circuit 12 as shown in FIG. 2. Therefore, a circuit area increases due to the two protection circuits.

In the integrated circuit 100 according to the first embodiment, the shutoff control circuit 13 is provided such that both a circuit (not separately shown) to which the first power supply voltage Vdd is applied and the internal circuit 12 can be protected by the HV protection circuit 11. Therefore, it is not necessary to provide two ESD protection circuits. Further, the third transistor 43 of the shutoff control circuit 13 is provided to switch the on/off state of the second transistor 42. Therefore, it is not necessary to pass a large current through the third transistor 43, and a transistor of a small size can be used. Consequently, a circuit area of the integrated circuit 100 according to the first embodiment can be reduced.

Modification of First Embodiment (Structure of Integrated Circuit 101)

An integrated circuit 101 according to a modification of the first embodiment will be described with reference to FIG. 5.

Figure 5:
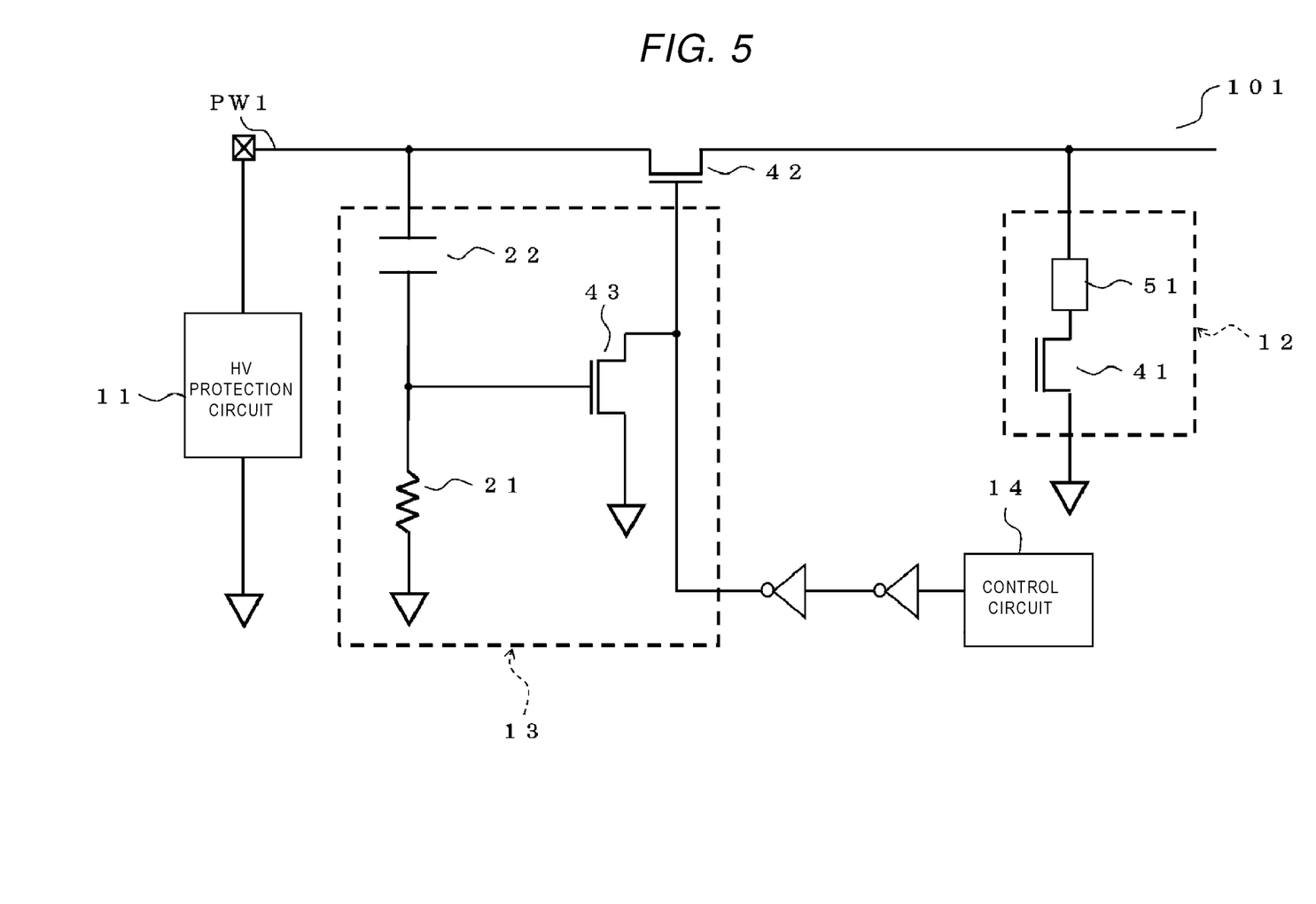
FIG. 5 is a circuit diagram of an integrated circuit according to a modification of a first embodiment.

The integrated circuit 101 according to the modification of the first embodiment as shown in FIG. 5 is different from the integrated circuit 100 according to the first embodiment in the arrangement of the capacitive element 21 and the resistive element 21. In the integrated circuit 101, one end of the capacitive element 22 is connected to the first power supply line PW1 between the HV protection circuit 11 and the drain of the second transistor 42, one end of the resistive element 21 is connected to another end of the capacitive element 22, and another end of the resistive element 21 is connected to the ground potential. Further, unlike the integrated circuit 100, no inverter is provided between the gate of the third transistor 43 and the portion between the resistive element 21 and the capacitive element 22. Except for these configurations and their operations, the integrated circuit 101 are the same or substantially the same as the integrated circuit 100.

(Operation of Integrated Circuit 101)

During the ESD operation, when the positive voltage generated by the ESD is applied to the first power supply line PW1 from the first power supply (not separately shown), the amount of charges of the first power supply line PW1 increases, and the potential of the first power supply line PW1 increases. The voltage generated by the ESD is, for example, several thousand volts. Similarly to the integrated circuit 100 according to the first embodiment, the resistance value R1 of the resistive element 21 and the capacitance C2 of the capacitive element 22 are determined such that the product R1×C2 (that is the RC time constant) of the resistance value R1 and the capacitance C2 is sufficiently greater than the time during which the instantaneous surge current generated by the ESD flows in. During a time of the RC time constant, a potential between the capacitive element 22 and the resistive element 21 is substantially the same as a potential of the first power supply line PW1. As a result, a voltage is applied to the gate of the third transistor 43, and the third transistor 43 is turned on. The drain of the third transistor 43 is at the ground potential. No voltage is applied to the gate of the second transistor 42, and the second transistor 42 is turned off. The surge current input to the first power supply line PW1 passes through the HV protection circuit 11 and is discharged to the ground instead of reaching the internal circuit 12.

During the normal operation in which no voltage generated by the ESD is applied to the first power supply line PW1, the first power supply voltage Vdd is maintained at a constant value. Therefore, charges are accumulated in the capacitive element 22. The potential between the capacitive element 22 and the resistive element 21 is lower than the potential of the first power supply line PW1. Therefore, the third transistor 43 is maintained in the off state.

The integrated circuit 101 according to the present modification of the first embodiment has the same or substantially the same effect as that of the integrated circuit 100 according to the first embodiment.

Figure 6:
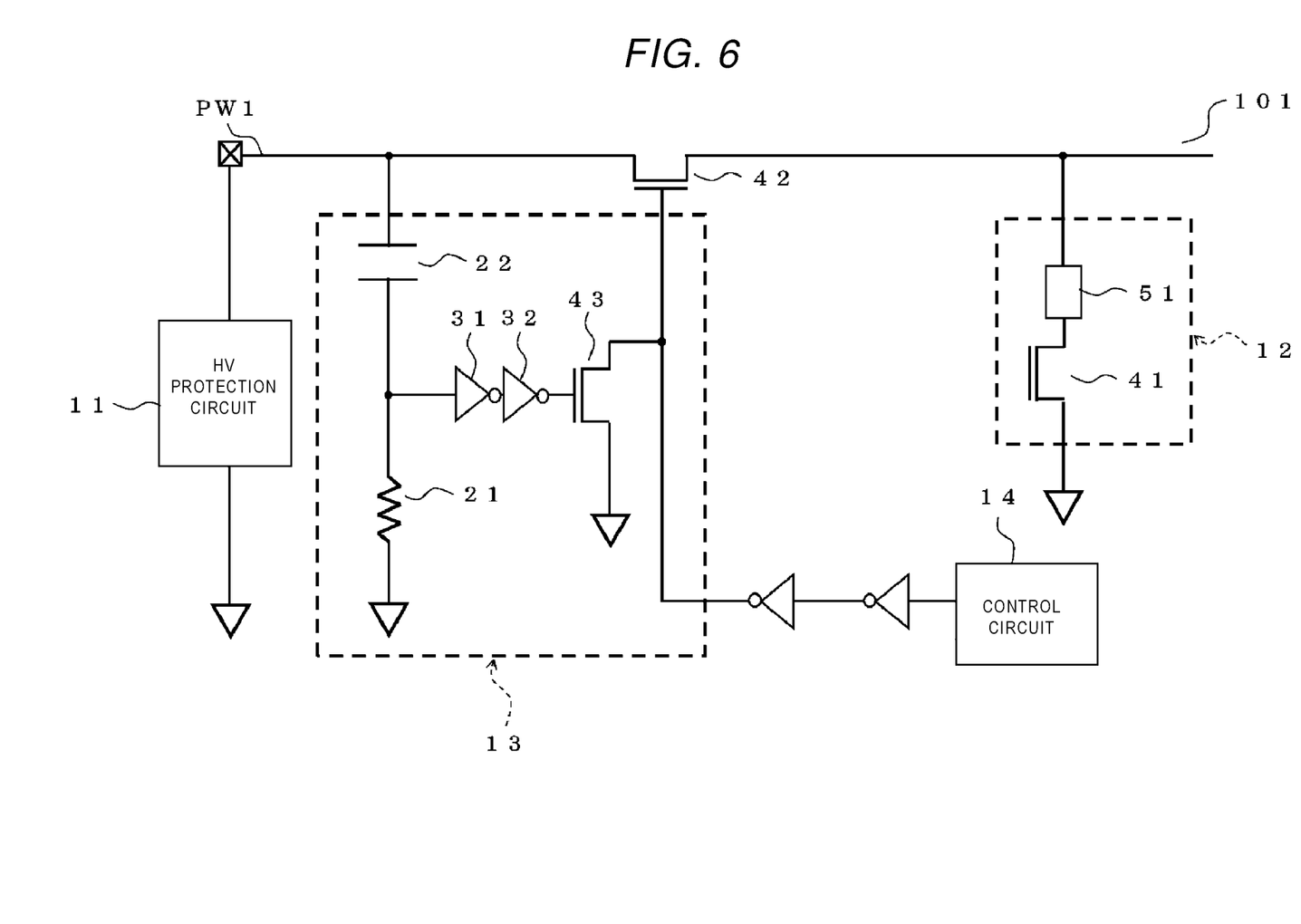
FIG. 6 is a circuit diagram of an integrated circuit according to a modification of a first embodiment.

FIG. 5 shows the case where no inverter is provided between the gate of the third transistor 43 and the portion between the capacitive element 22 and the resistive element 21. In another case, as shown in FIG. 6, a plurality of inverters, such as the first inverter 31 and a second inverter 32, may be connected in series between the gate of the third transistor 43 and the portion between the capacitive element 22 and the resistive element 21. In the latter case, the plurality of inverters are provided such that the third transistor 43 is maintained at the off state during the ESD operation.

FIG. 6 shows the first inverter 31 and a second inverter 32 are connected in series between the gate of the third transistor 43 and the node between the capacitive element 22 and the resistive element 21. The third transistor 43 is maintained at the off state during the ESD operation. When one or more inverters are provided between the gate of the third transistor 43 and the node between the capacitive element 22 and the resistive element 21, the gate of the third transistor 43 and the portion between the capacitive element 22 and the resistive element 21 are still electrically connected to each other.

Second Embodiment (Structure of Integrated Circuit 200)

An integrated circuit 200 according to a second embodiment will be described with reference to FIG. 3.

In the integrated circuit 200 according to the second embodiment, the HV protection circuit 11 is configured with an RC Trigger MOS (RCTMOS) that includes a resistive element, a capacitive element, and inverters, as compared to the first embodiment. The resistive element and the capacitive element of the HV protection circuit 11 are used or shared as the resistive element 21 and the capacitive element 22 of the shutoff control circuit 13. The inverter of the HV protection circuit 11 is used as the first inverter 31 of the shutoff control circuit 13.

The HV protection circuit 11 includes the resistive element 21, the capacitive element 22, the first inverter 31, the second inverter 32, a third inverter 33, and the fourth transistor 44. One end of the resistive element 21 is connected to the first power supply line PW1. One end of the capacitive element 22 is connected to another end of the resistive element 21, and another end of the capacitive element 22 is connected to the ground potential.

The input terminal of the first inverter 31 is connected between the resistive element 21 and the capacitive element 22. An input terminal of the second inverter 32 is connected to the output terminal of the first inverter 31. An input terminal of the third inverter 33 is connected to an output terminal of the second inverter 32. An output terminal of the third inverter 33 is connected to a gate of the fourth transistor 44. The first, second and third inverters 31, 32 and 33 are connected in series between the gate of the fourth transistor 44 and the portion between the resistive element 21 and the capacitive element 22. The output terminal of the first inverter 31 and the gate of the fourth transistor 44 are electrically connected to each other. The output terminal of the second inverter 32 and the gate of the fourth transistor 44 are electrically connected to each other. A drain of the fourth transistor 44 is connected to the first power supply line PW1. A source of the fourth transistor 44 is connected to the ground potential. The fourth transistor 44 has a breakdown voltage higher than the breakdown voltage of the first transistor 41.

The drain of the second transistor 42 is connected to the drain of the fourth transistor 44 via the first power supply line PW1. The source of the second transistor 42 is connected to the internal circuit 12 via the first power supply line PW1. The second transistor 42 switches between conduction and non-conduction of a current flowing through the first power supply line PW1 between the drain of the fourth transistor 44 and the internal circuit 12.

The gate of the third transistor 43 is electrically connected to the output terminal side of the first inverter 31 by a path P1. The path P1 electrically connects the gate of the third transistor 43 and a portion or a node between the first inverter 31 and the gate of the fourth transistor 44.

FIG. 3 shows the case where the second inverter 32 and the third inverter 33 are connected in series between the first inverter 31 and the gate of the fourth transistor 44. In another case, only the first inverter 31 may be provided.

Figure 9:
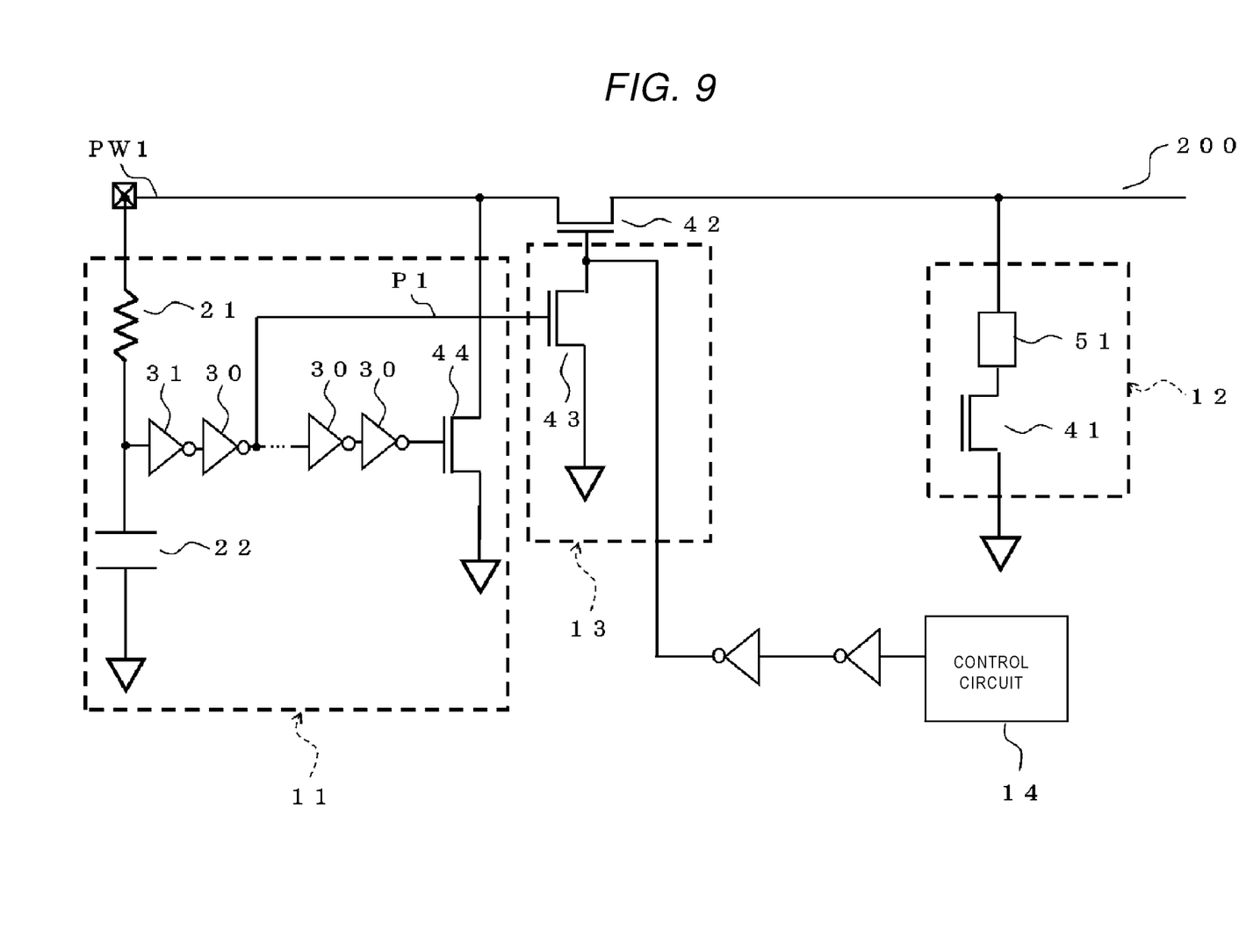
FIG. 9 is a circuit diagram of an integrated circuit according to a second embodiment.

In still another case, as shown in FIG. 9, a set or a group of one or more inverters 30 connected in series to each other may be provided between the first inverter 31 and the gate of the fourth transistor 44. In such a case, the output terminal of the first inverter 31 and the gate of the fourth transistor 44 are also electrically connected to each other.

Further, FIG. 3 shows the case where the gate of the third transistor 43 is connected to the path P1 via the output terminal of the first inverter 31. In the case as shown in FIG. 9, the path P1 may connect the gate of the third transistor 43 to an input terminal of one inverter 30 to which an H-level is input during the ESD operation among the one or more inverters 30 provided between the first inverter 31 and the gate of the fourth transistor 44.

Figure 10:
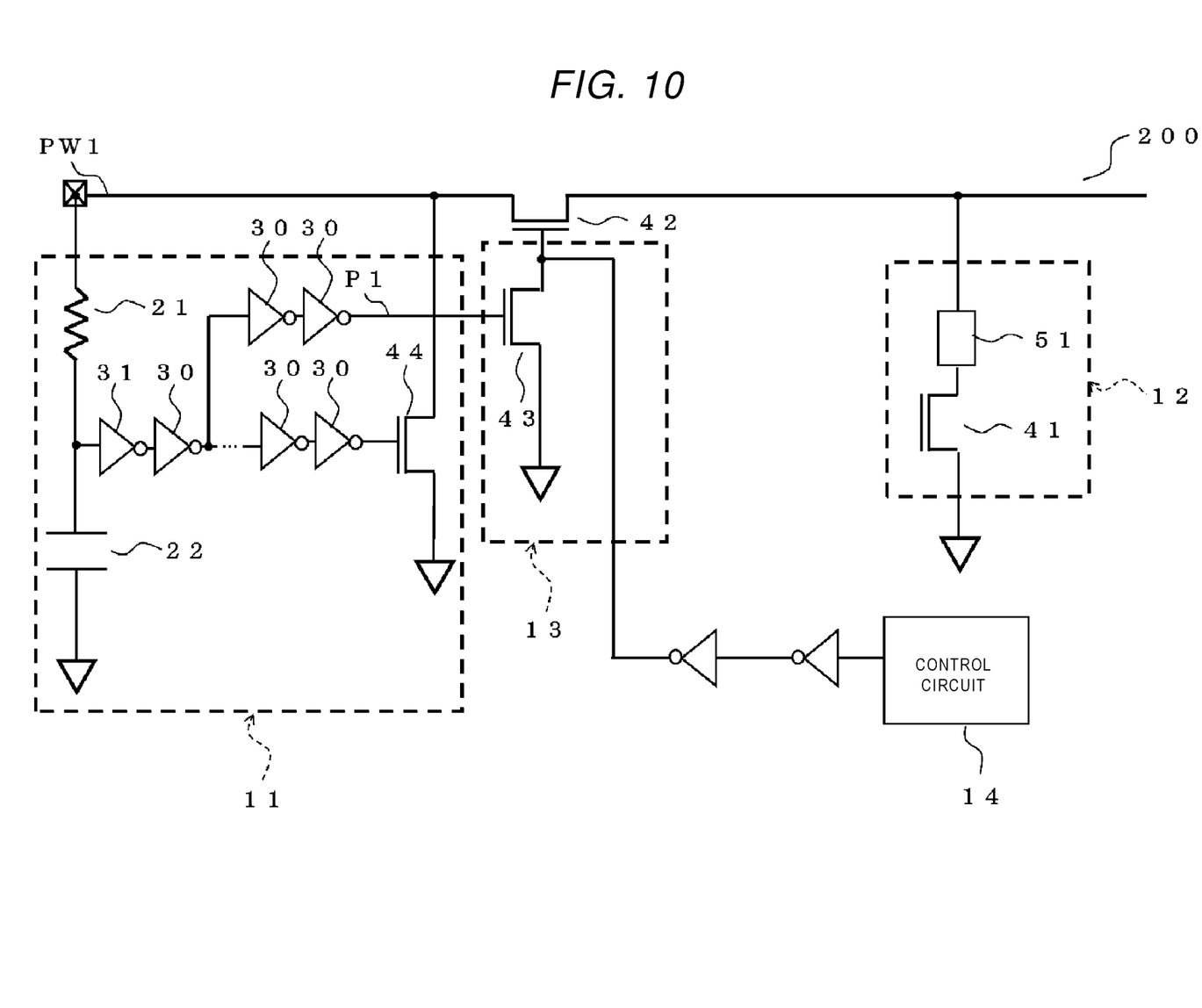
FIG. 10 is a circuit diagram of an integrated circuit according to a second embodiment.

In a further case, as shown in FIG. 10, another set or group of one or more inverters 30 connected in series to each other may be provided in the path P1. An output terminal of one inverter 30 directly connected to the gate of the third transistor 43 among the one or more inverters 30 connected in the path P1 outputs an H-level during the ESD operation. In such a case, the output terminal side of the first inverter 31 and the gate of the third transistor 43 are also electrically connected to each other.

(Operation of Integrated Circuit 200)

When the positive voltage generated by the ESD is applied to the first power supply line PW1 from the first power supply (not separately shown), the amount of charges of the first power supply line PW1 increases and the potential of the first power supply line PW1 increases. Similarly to the integrated circuit 100 according to the first embodiment, the R1 and the C2 are determined such that the RC time constant of the resistive element 21 and the capacitive element 22 is sufficiently greater than the time during which the instantaneous surge current generated by the ESD flows in. Therefore, the first inverter 31 receives an L-level through the input terminal thereof and outputs an H-level. As a result, a voltage is applied to the gate of the third transistor 43, and the third transistor 43 is turned on. The drain of the third transistor 43 is at the ground potential. No voltage is applied to the gate of the second transistor 42, and the second transistor 42 is turned off. The second inverter 32 receives an H-level through the input terminal thereof and outputs an L-level. The third inverter 33 receives the L-level through the input terminal thereof and outputs an H-level. Therefore, a voltage is applied to the gate of the fourth transistor 44, and the fourth transistor 44 is turned on. As a result, the surge current flows from the first power supply line PW1 to the fourth transistor 44 and is discharged to the ground.

Effect of Second Embodiment

In the integrated circuit 200 according to the second embodiment, the resistive element, the capacitive element, and the inverter of the HV protection circuit 11 are used or shared as the resistive element 21, the capacitive element 22, and the first inverter 31 of the shutoff control circuit 13. Therefore, only the third transistor 43 is needed for the shutoff control circuit 13 in the integrated circuit 200 according to the second embodiment, and an area of a semiconductor element can be further reduced.

Modification of Second Embodiment (Structure of Integrated Circuit 201)

An integrated circuit 201 according to a modification of the second embodiment will be described with reference to FIG. 7.

The integrated circuit 201 according to the modification of the second embodiment is different from the integrated circuit 200 according to the second embodiment in the arrangement of the resistive element 21 and the capacitive element 22. In the integrated circuit 201, one end of the capacitive element 22 of the HV protection circuit 11 is connected to the first power supply line PW1, another end of the capacitive element 22 is connected to one end of the resistive element 21, and another end of the resistive element 21 is connected to the ground potential. The first inverter 31 and the second inverter 32 are connected in series between the gate of the fourth transistor 44 and the portion between the capacitive element 22 and the resistive element 21. The gate of the third transistor 43 is electrically connected to the input terminal of the first inverter 31 by the path P1. Except for these configurations and their operations, the integrated circuit 201 are the same or substantially the same as the integrated circuit 200.

(Operation of Integrated Circuit 201)

When the positive voltage generated by the ESD is applied to the first power supply line PW1 from the first power supply (not separately shown), the amount of charges of the first power supply line PW1 increases, and the potential of the first power supply line PW1 increases. Similar to the integrated circuit 200 according to the second embodiment, the R1 and the C2 are determined such that the RC time constant of the capacitive element 22 and the resistive element 21 is sufficiently greater than the time during which the instantaneous surge current generated by the ESD flows in. Therefore, the first inverter 31 receives an H-level through the input terminal thereof and outputs an L-level. The second inverter 32 receives the L-level through the input terminal thereof and outputs an H-level. As a result, a voltage is applied to the gate of the third transistor 43, and the third transistor 43 is turned on. The drain of the third transistor 43 is at the ground potential. No voltage is applied to the gate of the second transistor 42, and the second transistor 42 is turned off. The second inverter 32 receives the L-level through the input terminal thereof and outputs an H-level. Therefore, a voltage is applied to the gate of the fourth transistor 44, and the fourth transistor 44 is turned on. As a result, the surge current flows from the first power supply line PW1 to the fourth transistor 44 and is discharged to the ground.

The integrated circuit 201 according to the modification of the second embodiment has the same or substantially the same effect as that of the integrated circuit 200 according to the second embodiment.

Figure 7:
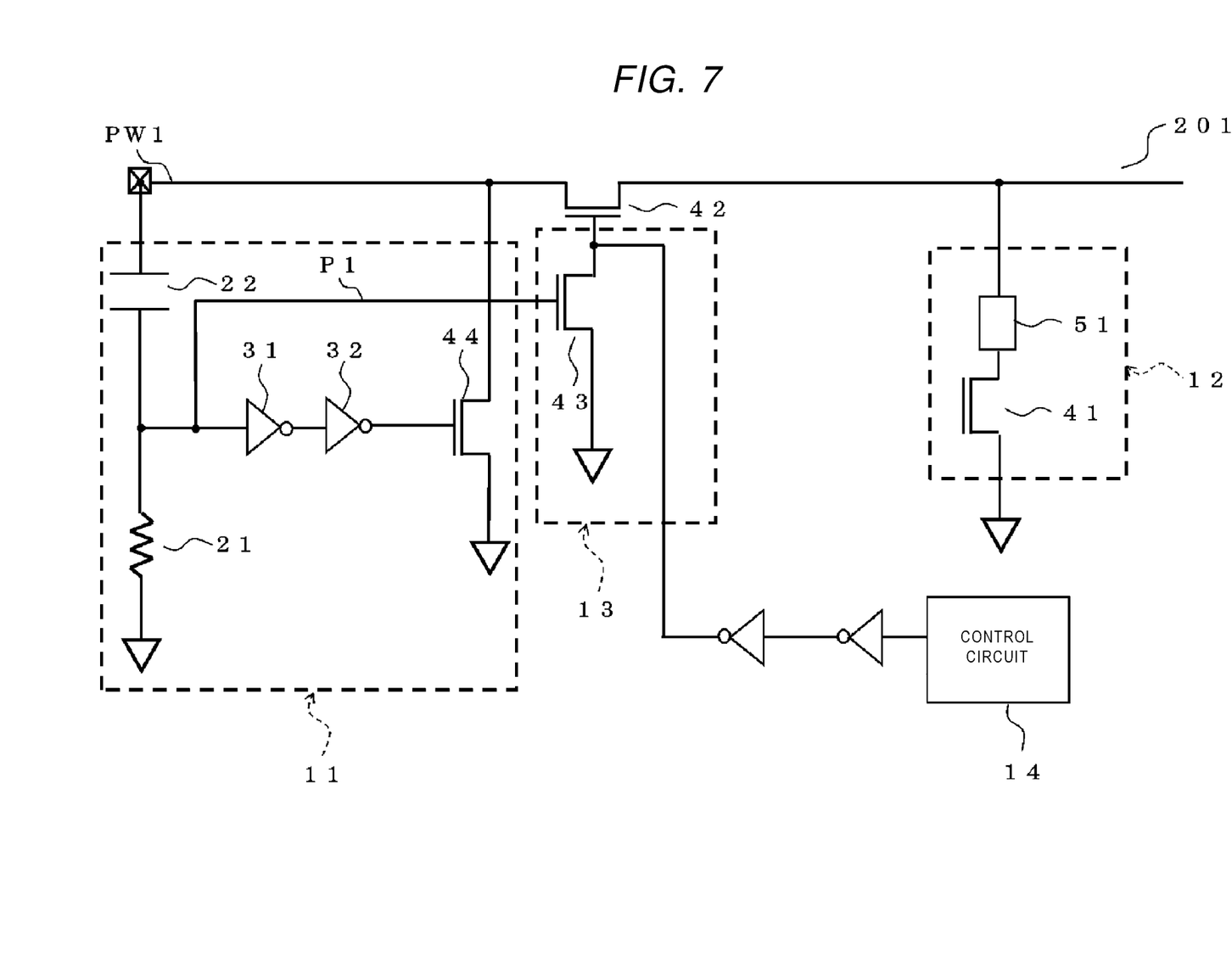
FIG. 7 is a circuit diagram of an integrated circuit according to a modification of a second embodiment.

While FIG. 7 shows the case where two inverters, the first inverter 31 and the second inverter 32, are provided between the gate of the fourth transistor 44 and the portion between the capacitive element 22 and the resistive element 21, the number of inverters connected between the gate of the fourth transistor 44 and the portion between the capacitive element 22 and the resistive element 21 is not limited to two. For example, a plurality of inverters 30 in place of the second inverter 32 may be connected in series between the output terminal of the first inverter 31 and the gate of the fourth transistor 44 such that the fourth transistor 44 is turned on during the ESD operation. In the latter case, the output terminal of the first inverter 31 and the gate of the fourth transistor 44 are also electrically connected to each other.

Figure 8:
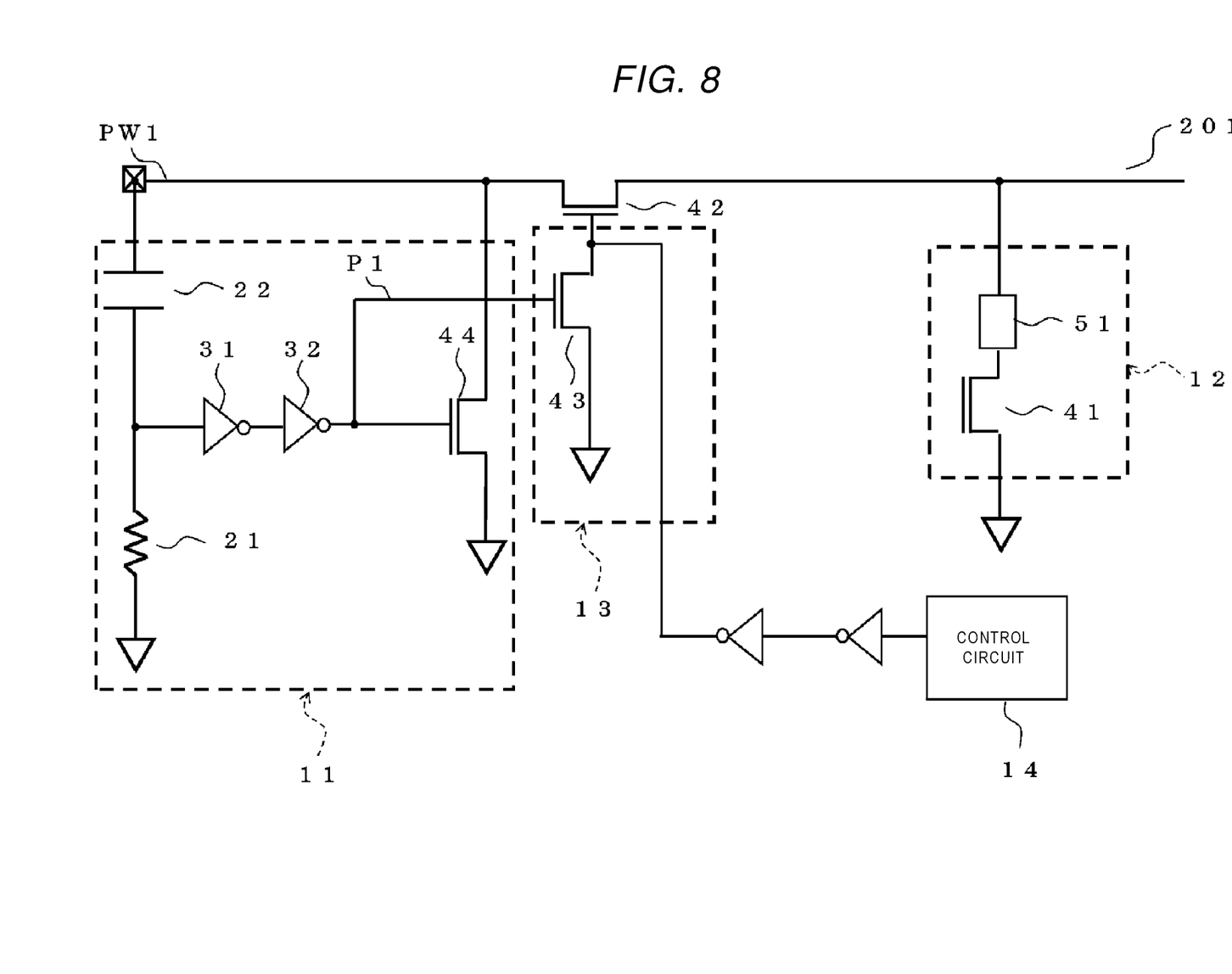
FIG. 8 is a circuit diagram of an integrated circuit according to a modification of a second embodiment.

As another modification to the integrated circuit 202 of the second embodiment, to turn on the third transistor 43 during the ESD operation, the third transistor 43 may be connected to the path P1 passing through an output terminal of an inverter that outputs an H-level among the first inverter 31, the second inverter 32, and, if provided in place of the second inverter 32, the plurality of inverters 30 that are connected in series between the gate of the fourth transistor 44 and the portion between the capacitive element 22 and the resistive element 21. As one example, as shown in FIG. 8, the gate of the third transistor 43 may be electrically connected to the output terminal of the second inverter 32 by the path P1. In this case, the gate of the third transistor 43 is electrically connected to the output terminal side of the first inverter 31 by the path P1. That is, the path P1 electrically connects the gate of the third transistor 43 and a portion between the first inverter 31 and the gate of the fourth transistor 44. Also, in the example case of FIG. 8, in a similar manner to the integrated circuit 200 shown in FIG. 10, one or more inverters 30 may be provided in the path P1.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An integrated circuit, comprising:
   a first power supply line to which a first power supply voltage can be supplied;
   a protection circuit connected to the first power supply line;
   an internal circuit including a first transistor, a drain or a source of the first transistor being connected to the first power supply line, a breakdown voltage of the first transistor being lower than the first power supply voltage;
   a second transistor on the first power supply line between the protection circuit and the internal circuit and configured to switch between conduction and non-conduction states to connect and disconnect the protection circuit and the internal circuit from each other along the first power supply line; and
   a shutoff control circuit configured to place the second transistor in the non-conduction state during an ESD operation, wherein
   the shutoff control circuit includes:
      a resistive element and a capacitive element connected in series between the first power supply line and a ground potential;
      a first inverter having an input terminal connected to a node between the resistive element and the capacitive element; and
      a third transistor having a gate connected to an output terminal of the first inverter, a drain connected to a gate of the second transistor, and a source connected to a ground potential.

2. The integrated circuit according to claim 1, wherein the shutoff control circuit further includes:
   at least one inverter connected between the output terminal of the first inverter and the gate of the third transistor.

3. An integrated circuit, comprising:
   a first power supply line to which a first power supply voltage can be supplied;
   a protection circuit connected to the first power supply line;
   an internal circuit including a first transistor, a drain or a source of the first transistor being connected to the first power supply line, a breakdown voltage of the first transistor being lower than the first power supply voltage;
   a second transistor on the first power supply line between the protection circuit and the internal circuit and configured to switch between conduction and non-conduction states to connect and disconnect the protection circuit and the internal circuit from each other along the first power supply line; and
   a shutoff control circuit configured to place the second transistor in the non-conduction state during an ESD operation, wherein
   the shutoff control circuit includes a resistive element and a capacitive element connected in series between the first power supply line and a ground potential,
   a first end of the capacitive element is connected to the first power supply line,
   a first end of the resistive element is connected to a second end of the capacitive element,
   a second end of the resistive element is connected to the ground potential, and
   the shutoff control circuit further includes:
      a third transistor having a gate connected to a node between the capacitive element and the resistive element, a drain connected to a gate of the second transistor, and a source connected to the ground potential.

4. The integrated circuit according to claim 3, wherein the shutoff control circuit further includes:
   a first inverter having an input terminal connected to a node between the capacitive element and the resistive element; and
   a second inverter having an input terminal connected to an output terminal of the first inverter, and an output terminal connected to the gate of the third transistor.

5. The integrated circuit according to claim 1, wherein
   a first end of the resistive element is connected to the first power supply line,
   a first end of the capacitive element is connected to a second end of the resistive element, and
   a second end of the capacitive element is connected to the ground potential.

6. The integrated circuit according to claim 1, further comprising:
   a control circuit connected to a gate of the second transistor and configured to control the conduction and non-conduction states of the second transistor for operations of the internal circuit.

7. The integrated circuit according to claim 1, wherein the internal circuit includes a fuse element connected between the first transistor and the first power supply line.

8. The integrated circuit according to claim 1, wherein the internal circuit is a one-time programmable memory.

9. An integrated circuit, comprising:
   a first power supply line to which a first power supply voltage can be supplied;
   an internal circuit including a first transistor, a drain or a source of the first transistor being connected to the first power supply line, a breakdown voltage of the first transistor being lower than the first power supply voltage;
   a protection circuit including:
      a resistive element and a capacitive element connected in series between the first power supply line and a ground potential,
      a first inverter with an input terminal connected to a node between the resistive element and the capacitive element, and
      a fourth transistor with a gate connected to an output terminal of the first inverter, a drain connected to the first power supply line, and a source connected to the ground potential;
   a second transistor on the first power supply line between the drain of the fourth transistor and the internal circuit and configured to switch between conduction and non-conduction states to connect and disconnect the protection circuit and the internal circuit from each other along the first power supply line; and
   a shutoff control circuit including a third transistor having a gate connected to an output terminal of the first inverter, a drain connected to a gate of the second transistor, and a source connected to the ground potential.

10. The integrated circuit according to claim 9, wherein the protection circuit further includes:
    a second inverter having an input terminal connected to the output terminal of the first inverter, and an output terminal of the second inverter connected to the gate of the fourth transistor.

11. The integrated circuit according to claim 9, wherein the protection circuit further includes:
    a plurality of second inverters connected in series between the output terminal of the first inverter and the gate of the fourth transistor, and
    the gate of the third transistor is connected to a node between a pair of second inverters in the plurality of second inverters.

12. The integrated circuit according to claim 11, further comprising:
    at least one inverter on a path between the gate of the third transistor and the node between the pair of second inverters.

13. The integrated circuit according to claim 9, wherein
    a first end of the resistive element is connected to the first power supply line,
    a first end of the capacitive element is connected to a second end of the resistive element, and
    a second end of the capacitive element is connected to the ground potential.

14. The integrated circuit according to claim 9, further comprising:
    a control circuit connected to a gate of the second transistor and configured to control the conduction and non-conduction states of the second transistor for operations of the internal circuit.

15. The integrated circuit according to claim 9, wherein the internal circuit includes a fuse element connected between the first transistor and the first power supply line.

16. An integrated circuit, comprising:
    a first power supply line to which a first power supply voltage can be supplied;

an internal circuit including a first transistor, a drain or a source of the first transistor being connected to the first power supply line, a breakdown voltage of the first transistor being lower than the first power supply voltage;

a protection circuit including:
    a capacitive element with a first end connected to the first power supply line,
    a resistive element with a first end connected to a second end of the capacitive element, a second end of the resistive element being connected to a ground potential,
    a first inverter with an input terminal connected to a node between the first end of the resistive element and the second end of the capacitive element,
    a second inverter with an input terminal connected to an output terminal of the first inverter, and
    a fourth transistor having gate connected to an output terminal of the second inverter, a drain connected to the first power supply line, and a source connected to the ground potential;

a second transistor on the first power supply line between the drain of the fourth transistor and the internal circuit and configured to switch between conduction and non-conduction states to electrically connect and disconnect the protection circuit and the internal circuit from each other along the first power supply line; and a shutoff control circuit including a third transistor having a gate connected to the input terminal of the first inverter, a drain connected to a gate of the second transistor, and a source connected to the ground potential.

17. The integrated circuit according to claim 16, further comprising:
    a control circuit connected to a gate of the second transistor and configured to control the conduction and non-conduction states of the second transistor for operations of the internal circuit.

18. The integrated circuit according to claim 16, wherein the internal circuit includes a fuse element connected between the first transistor and the first power supply line.

* * * * *